(12) United States Patent
Letertre et al.

(10) Patent No.: US 9,041,165 B2
(45) Date of Patent: May 26, 2015

(54) RELAXATION AND TRANSFER OF STRAINED MATERIAL LAYERS

(75) Inventors: Fabrice Letertre, Grenoble (FR); Bruce Faure, Paris (FR); Pascal Guenard, Froges (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/201,365

(22) PCT Filed: Jan. 11, 2010

(86) PCT No.: PCT/EP2010/000090
§ 371 (c)(1),
(2), (4) Date: Aug. 12, 2011

(87) PCT Pub. No.: WO2010/094371
PCT Pub. Date: Aug. 26, 2010

(65) Prior Publication Data
US 2011/0291247 A1    Dec. 1, 2011

(30) Foreign Application Priority Data
Feb. 19, 2009    (EP) .................................... 09290100

(51) Int. Cl.
*H01L 21/762* (2006.01)
*H01L 21/02* (2006.01)
*C30B 29/40* (2006.01)
(Continued)

(52) U.S. Cl.
CPC ........ *H01L 21/02664* (2013.01); *H01L 21/762* (2013.01); *C30B 29/403* (2013.01); *C30B 33/02* (2013.01); *C30B 33/06* (2013.01); *H01L 21/02381* (2013.01); *H01L 21/0242* (2013.01); *H01L 21/0243* (2013.01); *H01L 21/02458* (2013.01); *H01L 21/0254* (2013.01); *H01L 21/76254* (2013.01)

(58) Field of Classification Search
CPC ........ C30B 29/403; C30B 33/02; C30B 33/06
USPC .......................................... 257/623; 438/458
See application file for complete search history.

(56) References Cited

U.S. PATENT DOCUMENTS 4,727,047 A    2/1988 Bozler et al.
5,273,616 A   12/1993 Bozler et al.
(Continued)

FOREIGN PATENT DOCUMENTS

EP    1870945 A1   12/2007
EP    1885001 A1    2/2008
(Continued)

OTHER PUBLICATIONS

International Search Report for International Application No. PCT/EP2010/000090 dated Oct. 6, 2011, 3 pages.
(Continued)

*Primary Examiner* — Colleen A Matthews
*Assistant Examiner* — William Harriston
(74) *Attorney, Agent, or Firm* — TraskBritt

(57) ABSTRACT

A method for the formation of an at least partially relaxed strained material layer, comprises providing a seed substrate; patterning the seed substrate; growing a strained material layer on the patterned seed substrate; transferring the strained material layer from the patterned seed substrate to an intermediate substrate; and at least partially relaxing the strained material layer by a heat treatment.

15 Claims, 3 Drawing Sheets

(51) Int. Cl.
*C30B 33/02* (2006.01)
*C30B 33/06* (2006.01)

(56) References Cited

U.S. PATENT DOCUMENTS

| | | | |
|---|---|---|---|
| 5,588,994 | A | 12/1996 | Bozler et al. |
| 5,676,752 | A | 10/1997 | Bozler et al. |
| 6,562,127 | B1 | 5/2003 | Kud et al. |
| 6,878,607 | B2 | 4/2005 | Inoue et al. |
| 7,273,798 | B2 | 9/2007 | Lester et al. |
| 8,173,512 | B2 | 5/2012 | Ghyselen et al. |
| 2004/0206299 | A1 | 10/2004 | Tadatomo et al. |
| 2007/0022940 | A1 | 2/2007 | Boussagol et al. |
| 2007/0026643 | A1 | 2/2007 | Tadatomo et al. |
| 2007/0054465 | A1* | 3/2007 | Currie et al. ............... 438/455 |
| 2008/0211061 | A1 | 9/2008 | Atwater, Jr. |
| 2010/0032793 | A1* | 2/2010 | Guenard et al. ........... 257/507 |

FOREIGN PATENT DOCUMENTS

| | | |
|---|---|---|
| EP | 1930957 A1 | 6/2008 |
| FR | 2894989 A1 | 6/2007 |
| JP | 02283014 A | 11/1990 |
| JP | 04010536 A | 1/1992 |
| JP | 06020945 A | 1/1994 |
| JP | 11026733 A | 1/1999 |
| JP | 2001176813 A | 6/2001 |
| JP | 2006519488 A | 8/2006 |
| WO | 2005029576 A2 | 3/2005 |
| WO | 2007030368 A2 | 3/2007 |

OTHER PUBLICATIONS

Kostrzewa, M., et al., "Feasibility of III-V on-Silicon Strain Relaxed Substrates," Journal of Crystal Growth, vol. 275(2005) pp. 157-166.

Yin et al., "Tunable Uniaxial vs Biaxial In-Plane Strain Using Compliant Substrates," Applied Physics Letters, vol. 87, (2005) pp. 061922-1-061922-3.

International Preliminary Report on Patentability and Written Opinion for International Application No. PCT/EP2010/000090 dated Oct. 11, 2011, 7 pages.

Japanese Office Action for Japanese Application No. 2011-550437 dated Oct. 28, 2014, 2 pages.

Chinese Office Action and Search Report for Chinese Application No. 2010800069384 dated Dec. 26, 2013, 18 pages.

Japanese Office Action for Japanese Application No. 2011-550437 dated Apr. 1, 2014, 5 pages.

Korean Office Action for Korean Application No. 10-2011-7021557 dated Jun. 24, 2014, 5 pages.

* cited by examiner

RELAXATION AND TRANSFER OF STRAINED MATERIAL LAYERS

CROSS-REFERENCE TO RELATED APPLICATIONS

This is a national phase entry under 35 U.S.C. §371 of International Patent Application PCT/EP2010/000090, filed Jan. 11, 2010, published in English as International Patent Publication WO 2010/094371 A2 on Aug. 26, 2010, which claims the benefit under Article 8 of the Patent Cooperation Treaty to European Patent Application Serial No. 09290100.8, filed Feb. 19, 2009, the entire disclosure of each of which is hereby incorporated herein by this reference.

TECHNICAL FIELD

The present invention relates to the field of compliant substrates employed in the manufacture of semiconductor devices and, in particular, to the relaxation of strained material islands and the transfer of the at least partially relaxed strained material islands to support substrates that can suitably be used for further semiconductor manufacture processes.

BACKGROUND

The growth of thin films on substrates by heteroepitaxy is an important manufacturing step in the semiconductor technology. For instance, in the field of light-emitting semiconductor devices or solar cells, there is a need to grow heteroepitaxial films on substrates as sapphire or SiC to form a final semiconductor device. After transfer of the heteroepitaxial films to another substrate, these films can, for instance, be used for epitaxial growth of layers used in electronic and opto-electronic applications.

However, when films are formed by heteroepitaxy on substrates with different lattice constants and different coefficients of thermal expansion as compared to the ones of the films, detrimental effects on material quality of layers grown on the films are caused by compressive/tensile strain and the corresponding generation of defects like dislocations, cracks, plastic relaxation, etc., that result in detrimental effects on the material quality of layers grown thereon.

Thus, in the art, compliant layers, e.g., low-viscosity layers, have been provided between the heteroepitaxial film and a target substrate in order to release the strains by heat treatment.

Presently used methods for the relaxation of strained heteroepitaxial films, however, often do not show satisfying results with respect to the suppression of buckling, etc. Moreover, the transfer of heteroepitaxial films grown on a seed (growth) substrate, including some seed layer to another substrate that is to be used for the further manufacture of a particular semiconductor, raises the problem of maintaining the heteroepitaxial films intact, in general, and, in particular, removing the seed substrate without damaging the heteroepitaxial films.

Therefore, it is a problem underlying the present invention to provide a method for the formation of reliably relaxed and intact material layers (islands) that can suitably be used for the manufacture of a semiconductor device.

BRIEF SUMMARY

The above-mentioned problem is solved by a method for the formation of an at least partially relaxed strained material layer, the method comprising the steps of:

providing a seed substrate;
patterning the seed substrate;
growing a strained material layer on the patterned seed substrate;
transferring the strained material layer from the patterned seed substrate to an intermediate substrate; and
at least partially relaxing the strained material layer by a heat treatment.

The expression "strained material layer" alternatively denotes a continuous or a discontinuous layer exhibiting islands. The seed substrate may be a massive uniform substrate or a hybrid substrate comprising a seed layer bonded to or grown on some support substrate. In the process of transferring the strained material layer from the patterned seed substrate to the intermediate substrate, the seed substrate may be removed by one or more of etching, mechanical polishing, grinding, electromagnetic or laser irradiation, etc. Residual material of the seed substrate that possibly remains atop of the strained material layer after the transfer can be removed by polishing or etching.

The expression "patterning" is used in a very general sense comprising a) structuring a surface of the seed substrate, e.g., by etching, in particular, plasma or chemical etching, or scribing irradiation and forming islands and recesses, and b) depositing a patterned mask on a surface of the seed substrate substantially without removing any material of the seed substrate.

Particularly, according to one embodiment, a method is provided for the formation of at least partially relaxed strained material islands comprising:

providing a seed substrate;
patterning the seed substrate to form seed substrate islands;
growing a strained material layer on the patterned seed substrate, in particular, on the seed substrate islands;
transferring the strained material layer from the patterned seed substrate to an intermediate substrate;
forming islands of the strained material layer; and
at least partially relaxing the strained material islands by a heat treatment.

The formation of the islands of the strained material may be directly achieved by epitaxially growing the strained material layer following a shape of a surface of the seed substrate islands and stopping the growth before coalescence of the grown strained material islands or by forming islands from a relatively plane surface of strained material obtained by epitaxially growing the strained material layer first following the shape of the surface of the seed substrate islands and then forming a plane surface by coalescence of the formed strained material islands.

It should be noted that, in general, the step of forming islands of the strained material layer can be performed either before the transfer from the patterned seed substrate to an intermediate substrate or after this transfer.

Alternatively, a patterned mask comprising closed and open regions (covering and exposing a surface of the seed substrate, respectively) is deposited on the seed substrate and strained material islands are grown on the seed substrate in the open regions of the patterned mask (exposed regions of the surface of the seed substrate). The grown strained material islands are subsequently transferred to an intermediate substrate and after the transfer, they are subject to heat treatment in order to at least partially relax the strained material islands on the intermediate substrate.

The strained material islands formed by means of the patterned seed substrate may have any desired shape, e.g., rectangular stripe-like or circular, and they may have dimensions of about 100×100 micrometers to some square millimeters.

Individual strained material islands may be spaced at some 10 micrometers to about 100 micrometers from each other. The depth of the recesses (trenches) in the seed substrate separating the strained material islands may range from a few nanometers to some tens of micrometers. The size of the islands and trenches may be adapted according to thermomechanical strain in the material.

By the inventive method according to one of the above-described examples, it is possible to directly obtain strained material islands on a patterned seed substrate by epitaxially growing the strained material on a surface of the seed substrate. In particular, the inventive method provides an advantage in that the crystalline quality of the grown strained material is significantly higher than in the prior art, wherein epitaxial growth on a continuous surface of a seed layer is performed. In particular, cracks are avoided. Since the difference of coefficients of thermal expansion between the strained material islands and seed substrate has a less significant impact on the crystalline quality, cracks are particularly avoided in the grown material. In other words, compared to conventionally manufactured strained material layers, in the present invention, it is possible to use a seed substrate with a higher difference of coefficients of thermal expansion with respect to the chosen strained material, e.g., GaN or InGaN, and still get the same desired crystalline quality.

Since it is possible to use more mismatched seed substrates, low-cost substrates can be employed, which was not allowable in the prior art. These low-cost substrates can be removed and disposed without any need for re-cycling. For example, silicon seed substrates can be used to grow group III/V materials such as GaN and InGaN by epitaxy. Epitaxy of GaN and InGaN on silicon seed substrates can be performed with no detrimental effects if the silicon seed substrate is patterned before epitaxial growth.

Moreover, as the strain level may be lower in epitaxial material by using a patterned seed substrate, it is possible to use a seed substrate with a larger lattice mismatch and get the same crystalline quality than in conventional processes.

In addition, as the strain level may be lower with a patterned seed substrate, it may allow for a higher thickness of the resulting strained material islands as compared to the same seed substrate of a plane surface with no cracks.

In this context, it should also be noted that some buffer layers, as known in the art, may be provided between the seed substrate and the strained material in order to further increase the crystalline quality in the strained material. The buffer layer may show islands, due to the islands of the patterned seed substrate or may be a continuous layer if formed until islands of the buffer layer material corresponding to the islands of the seed substrate undergo coalescence.

For example, a GaN buffer is preferably deposited on a silicon patterned seed substrate before epitaxy of InGaN material. As cracks may be avoided in the GaN buffer layer, the quality of InGaN may be less damaged than by using a conventional method. Furthermore, the lattice mismatch strain may also be less significant in the GaN buffer, such that the strain in InGaN material may also be less significant. This allows a higher layer thickness or to use a higher indium content in the InGaN layer as compared to the prior art.

According to one example, preferably, the strained material island growth is stopped before an onset of island coalescence, that is, islands are kept apart from the others.

Alternatively, it is also conceivable to grow a strained layer on a seed substrate with islands (the top of the strained material layer has islands) having a size small enough to allow coalescence of the strained material. The size of pattern depends on the growth conditions and material, but the scale of the seed islands is usually on the order of nanometers. In this case, dislocations in the strained layer may be annihilated to lead to smaller dislocation density along with reducing defects and cracks. The method for forming islands of strained material is the same as used to pattern the seed substrate. It can be performed before or after transfer of the strained layer onto an intermediate substrate for the relaxation process.

In case of the use of a buffer layer, it is advantageous that the buffer layer is grown on the patterned seed substrate up to coalescence of the buffer layer. The strained material that is to be relaxed is then deposited on the continuous buffer layer. The low dislocation density in the buffer layer avoids damaging the strained material at the dislocation sites.

For the process of the transfer of the strained material layer (islands) to the intermediate substrate, the seed substrate must be detached from the strained material. This detachment can be facilitated by implanting ions in the seed substrate below the strained material layer to form a weakened layer and detaching the strained material layer from the seed substrate at the weakened layer by heat treatment.

Alternatively, ions can be implanted in the strained material layer to form a weakened layer and the strained material layer can be detached from the seed substrate at the weakened layer by heat treatment. In particular, detachment of the strained material layer without residual seed substrate material is thereby made possible. It goes without saying that the thermal budget of the heating treatment performed for the detachment of the seed substrate is different from the one performed for the relaxation of the strained material.

In the above examples, the step of transferring the strained material layer from the seed substrate to the intermediate substrate may comprise depositing a low-viscosity layer, in particular, a buried compliant layer, on the strained material layer and bonding the low-viscosity layer to the intermediate substrate.

The low-viscosity layer may comprise or consist of borophosphosilicate glass, BPSG, or an $SiO_2$ compound comprising boron or phosphorous. A similar layer may be deposited on the intermediate substrate before bonding it to the strained material layer (islands) for the transfer process. The heat treatment for relaxation of the strained material transferred to the intermediate substrate then allows for some reflow of the low-viscosity material layer, thereby resulting in at least partial relaxation of the strained material. By the expression "low-viscosity," reflow properties at the heat treatment are particularly denoted. The process of forming strained material islands may comprise patterning the deposited low-viscosity layer accordingly (see detailed description below). Borophosphosilicate glass exhibits desired reflow characteristics at temperatures of about 800° C. or 850° C., depending of the actual composition of the glass, thereby allowing relaxation of the strained material such as InGaN.

The partially relaxed strained material islands can be transferred to a target substrate. For this, a high-viscosity layer, e.g., a buried layer comprising or consisting of an oxide (thermal oxide material), may be formed on the at least partially relaxed strained material islands and bonded with the target substrate. The term "high-viscosity" refers to a glass transition temperature higher than the one of the "low-viscosity" material. For example, a low-viscosity BPSG layer that includes 4.5% of boron and 2% of phosphorous exhibits desired reflow characteristics at temperatures of about 800° C. Most low-viscosity oxide materials have a glass transition temperature of around 600° C. to 700° C. On the other hand, the glass transition temperature of the high-viscosity oxide material is above 1000° C. and preferably above 1200° C. The target substrate may be of the same material as the seed substrate or the intermediate substrate, for example.

When the strained material is polar, as for the c-plane III/N material, and when the process is performed by growing the strained material on a seed substrate followed by a two-step transfer process from the seed substrate to the intermediate substrate and from the intermediate substrate to the target substrate, the polarity of a face of the relaxed strained material opposing a face of growth on the seed substrate that is suitable for any subsequent epitaxial growth of layers can be maintained. In particular, for III/N material, if an exposed face exhibits a III-element polarity after the growth on the seed substrate, the exposed face after the two-step transfer process will also exhibit a III-element polarity that is the most suitable for a subsequent epitaxial growth of a III/N layer. If the exposed face after the growth is an N-face, a one-step transfer process may be enough to allow the subsequent epitaxy on a right polarity.

When the initial strained material is non-polar, the two-step transfer process may be avoided and an epitaxial growth may occur on the at least partially relaxed material bonded to the intermediate substrate. In this case, the low-viscosity layer may preferably be chosen to remain stable with no reflow at the temperature of the epitaxy.

The present invention, furthermore, provides a method for the manufacture of a semiconductor device, comprising providing an at least partially relaxed strained material on a target substrate according to one of the above-described examples, and further comprising epitaxially growing at least one material layer on the formed at least partially relaxed strained material layer/islands, in particular, layers for LED, photovoltaic, or laser devices.

Further, a wafer is provided, comprising:
a support structure, in particular, consisting of sapphire;
a high-viscosity layer; and
islands of at least partially relaxed strained material obtained by the method according to one of the above-described examples, in particular, with an area size from 100 micrometers×100 micrometers to 1 mm×1 mm, and of a thickness of more than 500 Angstroms.

The wafer may comprise at least one active layer on the relaxed strained material layer/islands, in particular, LED, laser, or photovoltaic device layers.

Additional features and advantages of the present invention will be described with reference to the drawings. In the description, reference is made to the accompanying figures that are meant to illustrate preferred embodiments of the invention. It is understood that such embodiments do not represent the full scope of the invention.

DETAILED DESCRIPTION

Figure 1:
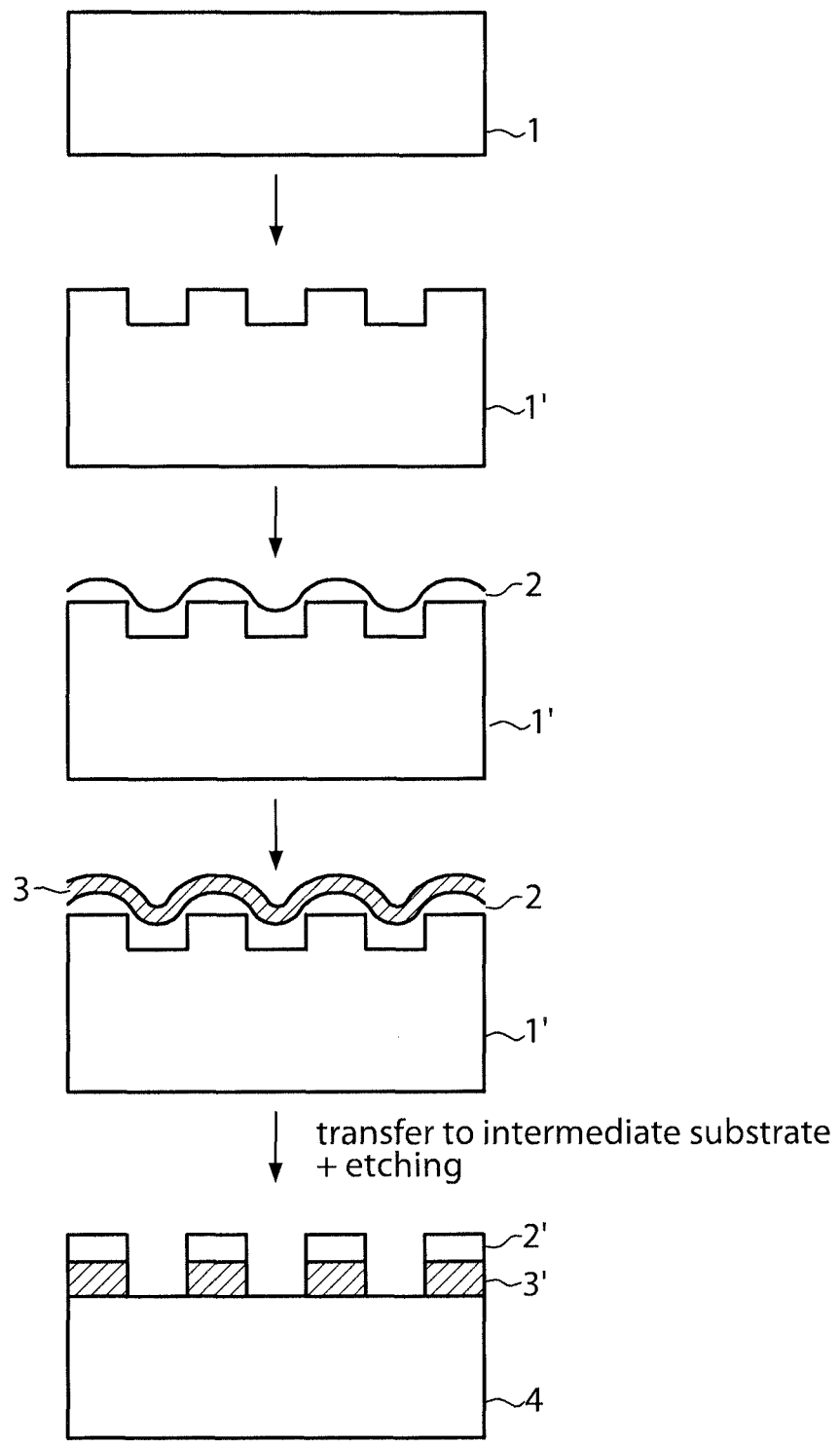
FIG. 1 illustrates an example of the inventive method comprising the steps of patterning a seed substrate by etching and growing a strained material layer on the patterned seed substrate.

In the following, two alternative embodiments of the herein disclosed method for the formation of at least partially relaxed strained material layers are described with reference to FIGS. 1 and 2. As shown in FIG. 1, a seed substrate 1 is provided for the growth of a strained material layer 2. The seed substrate 1 may be, e.g., a sapphire substrate or a silicon substrate. The seed substrate 1 is patterned by etching to obtain seed substrate islands 1' separated by recesses. The seed substrate islands 1' may be, e.g., sized to 1 mm×1 mm and spaced apart at about 10 micrometers to 1000 micrometers. The recesses may have a depth of about 1 micrometer.

After patterning of the seed substrate 1, epitaxy of a strained material, e.g., InGaN with 10% indium, is performed up to a thickness of the strained material layer 2 of about 250 nanometers. In order to improve the crystalline quality of the strained material layer 2, a buffer layer (not shown) may be deposited on the patterned seed substrate, in particular, the seed substrate islands 1', before growth of the strained material layer 2. The buffer layer may comprise an AlN nucleation layer 50 nm to 100 nm thick deposited on the silicon surface and below a GaN layer of a few micrometers thick. The growth of the buffer layer is stopped before coalescence of the material.

A low-viscosity (compliant) layer 3 is deposited on the strained material layer 2, in particular, above the seed substrate islands 1'. The thickness of the low-viscosity layer 3 may be about 500 nanometers.

A low-viscosity layer similar to the low-viscosity layer 3 is deposited on an intermediate substrate 4 to which the strained material layer 2 shall be transferred. The intermediate substrate 4 may be of the same material as the seed substrate 1, for example, made of silicon. The low-viscosity layer deposited on the intermediate substrate 4 may have a thickness of about 1 micrometer, for example. Then, both the low-viscosity layer 3 deposited on the strained material layer 2 and the low-viscosity layer deposited on the intermediate substrate 4 are polished. After this polishing step, which may result in a thickness of the low-viscosity material of about 1 micrometer, the strained material layer 2 is bonded via the low-viscosity layers to the intermediate substrate 4.

After the bonding step, the seed substrate 1 is removed, e.g., by plasma or chemical etching and/or grinding. Moreover, after removal of the seed substrate 1, low-viscosity material islands 3' may be obtained by etching. Alternatively, the low-viscosity layer 3 deposited on the strained material layer 2 is etched before the bonding/transfer to the intermediate substrate 4. In this case, after the transfer, the low-viscosity material that was deposited on the intermediate substrate 4 before the bonding step is etched in the spaces between the strained material islands 2' to obtain the low-viscosity material islands 3' shown in FIG. 1.

Figure 2:
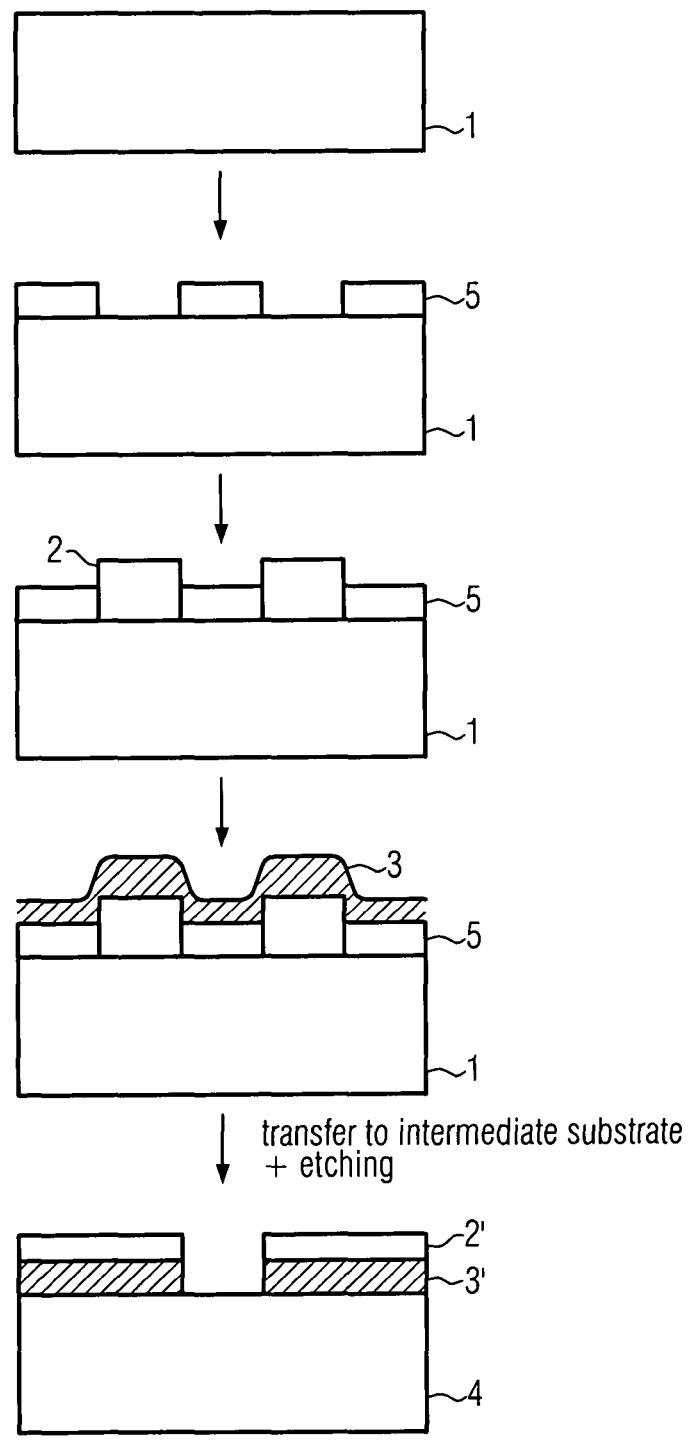
FIG. 2 illustrates another example of the inventive method comprising the steps of depositing a mask on a seed substrate comprising open regions and growing strained material islands on the seed substrate in the regions not covered by the mask.

FIG. 2 shows an alternative example of a method for obtaining the strained material islands 2' and low-viscosity material islands 3' on the intermediate substrate 4. As shown in FIG. 2, a seed substrate 1 (e.g., made of silicon or sapphire) is provided and partially covered by a mask layer 5. The mask layer 5 comprises open regions and may comprise $SiO_2$ or SiN material. In the open regions, strained material layer 2 (e.g., GaN or InGaN with an indium content of about 10%) is grown up to a thickness of 500 nm and a low-viscosity layer 3 is deposited on the strained material layer 2 and the mask layer 5. Bonding of the low-viscosity layer 3 and the low-viscosity layer deposited on the intermediate substrate 4 and subsequent removal of the seed substrate 1 results in a transfer of the strained material islands 2' to the intermediate substrate 4. Low-viscosity material islands 3' are etched down to the intermediate substrate 4 in the spaces between strained material islands 2', if this is needed to improve the subsequent relaxation step.

It should be noted that in both examples shown in FIGS. 1 and 2, alternatively, the strained material islands 2' may be provided on a continuous low-viscosity material layer on the intermediate substrate 4 (i.e., in particular, no etching of the low-viscosity layer deposited on an intermediate substrate 4 is performed).

The structures shown at the bottom of FIGS. 1 and 2 comprising the strained material islands 2' atop of the low-viscosity material islands 3' are subject to heat treatment, e.g., at about 800° C. to 850° C. over about 4 hours, in order to obtain at least partially relaxed strained material islands 2', e.g., partially relaxed InGaN islands with 10% indium, by reflow/plastic deformation of the low-viscosity material islands 3', e.g., borophosphosilicate glass, (BPSG), or an $SiO_2$— compound comprising boron or phosphorous.

Subsequently, a bonding layer can be deposited on the at least partially relaxed strained material islands 2' and/or on a target substrate. After bonding of the at least partially relaxed strained material islands 2' to the target substrate via the bonding layer(s), the intermediate substrate 4 and the low-viscosity material islands 3' can be removed, e.g., by etching or electromagnetic irradiation, to recover the surface of the at least partially relaxed strained material islands 2', e.g., InGaN islands. The at least partially relaxed strained material islands 2' can subsequently be used for the epitaxial growth of a structured material layer and, in particular, for epitaxial or homoepitaxial growth of a crystalline layer, that is to be employed in the manufacture of a particular semiconductor device useful in electronic, photovoltaic or opto-electronic applications such as LEDs or lasers.

Figure 3:
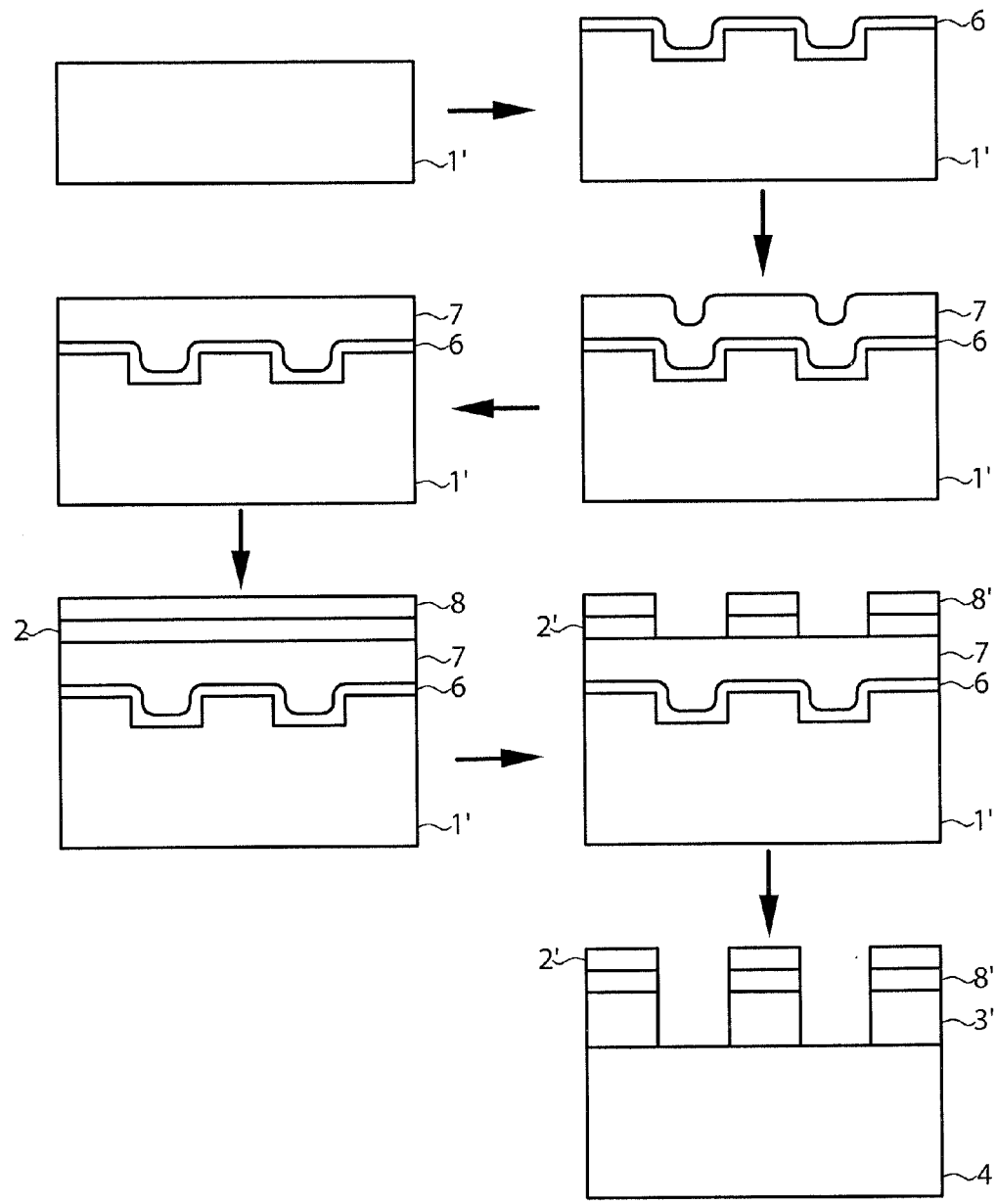
FIG. 3 illustrates another example of the inventive method wherein a strained material layer is grown on a buffer layer formed with a plane surface on a patterned seed substrate.

In FIG. 3, another example of the inventive method is shown wherein a strained material layer 2 is grown on a buffer layer 7 formed with a plane surface on a patterned seed substrate 1'. According to the example shown in FIG. 3, an AlN nucleation layer 6 is formed on a patterned seed substrate 1'. Subsequently, a buffer layer 7, e.g., comprising GaN, is deposited above the AlN nucleation layer 6. During the deposition, first, the buffer layer 7 adapts to the shape of the islands of the patterned seed substrate 1'. However, according to the example shown, the buffer layer 7 is deposited until the islands-like surface shape is leveled (coalescence of the islands of the buffer layer 7), such that a plane upper surface of the buffer layer 7 is formed.

At a top of a plane surface of the buffer layer 7, strained material layer 2 is epitaxially grown and a borophosphosilicate glass layer 8 is deposited at a top of a grown strained material layer 2. Subsequently, the borophosphosilicate glass layer 8 and the strained material layer 2 are patterned to obtain strained material islands 2' and borophosphosilicate glass islands 8'. After this patterning process, transfer to an intermediate substrate 4 by means of borophosphosilicate glass layer islands 3' formed on the intermediate substrate 4 is performed. It should be noted that the patterning of the borophosphosilicate glass layer 8 and the strained material layer 2 can also be performed after the transfer to the intermediate substrate 4. After the transfer of the strained material islands 2', relaxation can be carried out as described above.

All previously discussed embodiments are not intended as limitations but serve as examples illustrating features and advantages of the invention. It is to be understood that some or all of the above-described features can also be combined in different ways.

The invention claimed is:

1. A method for forming an at least partially relaxed strained material layer, the method comprising:

patterning a seed substrate by etching the seed substrate and forming seed substrate islands separated by recesses;

growing a strained material layer on the patterned seed substrate;

transferring the strained material layer from the patterned seed substrate to an intermediate substrate, transferring the strained material layer including:

depositing a low-viscosity compliant layer on the strained material layer; and bonding the low-viscosity compliant layer to the intermediate substrate;

forming islands of the strained material layer; and at least partially relaxing the islands of the strained material layer by a heat treatment after transferring the strained material layer from the patterned seed substrate to the intermediate substrate.

2. The method of claim 1, wherein transferring the strained material layer from the patterned seed substrate to the intermediate substrate comprises:

implanting ions in the patterned seed substrate below the strained material layer to form a weakened layer; and detaching the strained material layer from the patterned seed substrate at the weakened layer by heat treatment.

3. The method of claim 1, wherein transferring the strained material layer from the patterned seed substrate to the intermediate substrate comprises:

implanting ions in the strained material layer to form a weakened layer; and detaching the strained material layer from the patterned seed substrate at the weakened layer by heat treatment.

4. The method of claim 1, wherein transferring the strained material layer from the patterned seed substrate to the intermediate substrate comprises removing the patterned seed substrate using at least one of an electromagnetic irradiation process, a grinding process, a mechanical polishing process and an etching process.

5. The method of claim 1, further comprising growing at least one buffer layer prior to growing the strained material layer on the patterned seed substrate.

6. The method of claim 1, further comprising selecting the low-viscosity layer to comprise borophosphosilicate glass.

7. The method of claim 1, further comprising transferring the at least partially relaxed islands of the strained material layer to a target substrate.

8. The method of claim 1, further comprising selecting at least one of the seed substrate and the intermediate substrate to comprise sapphire or silicon.

9. The method of claim 1, wherein growing the strained material layer further comprises growing an InGaN or GaN strained material layer.

10. The method of claim 9, wherein growing an InGaN or GaN strained material layer comprises growing an InGaN layer including at least 3% In.

11. The method of claim 7, further comprising removing the intermediate substrate using at least one of an etching process, a mechanical polishing process, a grinding process, and an electromagnetic irradiation process.

12. The method of claim 1, further comprising transferring the at least partially relaxed islands of the strained material layer to a target substrate by depositing a high-viscosity layer on the at least partially relaxed islands of the strained material layer and bonding the high-viscosity layer to the target substrate.

13. A method for manufacturing a semiconductor device, comprising:

patterning a seed substrate by etching the seed substrate and forming seed substrate islands separated by recesses;

growing a strained material layer on the patterned seed substrate;

transferring the strained material layer from the patterned seed substrate to an intermediate substrate, transferring the strained material layer including:
   depositing a low-viscosity compliant layer on the strained material layer; and
   bonding the low-viscosity compliant layer to the intermediate substrate;

forming islands of the strained material layer;

at least partially relaxing the islands of the strained material layer by a heat treatment after transferring the strained material layer from the patterned seed substrate to the intermediate substrate;

transferring the at least partially relaxed islands of the strained material layer to a target substrate; and epitaxially growing at least one material layer on the transferred at least partially relaxed islands of the strained material layer.

14. The method of claim 1, further comprising forming islands of the low-viscosity compliant layer disposed between the islands of the strained material layer and the intermediate substrate prior to at least partially relaxing the islands of the strained material layer.

15. The method of claim 13, further comprising forming islands of the low-viscosity compliant layer disposed between the islands of the strained material layer and the intermediate substrate prior to at least partially relaxing the islands of the strained material layer.

\* \* \* \* \*